United States Patent [19]
Elwell et al.

[11] Patent Number: 5,641,546
[45] Date of Patent: Jun. 24, 1997

[54] PASSIVATION OF ELECTRONIC MODULES USING HIGH DENSITY PLASMAS

[75] Inventors: Dennis F. Elwell, San Clemente; Charles Zarowin, Pacific Palisades, both of Calif.

[73] Assignee: Hughes Aircraft Company, Los Angeles, Calif.

[21] Appl. No.: 643,657

[22] Filed: May 6, 1996

[51] Int. Cl.$^6$ .................................................. H05H 1/30
[52] U.S. Cl. ..................... 427/575; 427/99; 427/255.2; 427/294; 427/571; 427/579
[58] Field of Search ........................ 427/99, 579, 255.2, 427/294, 571, 575

[56] References Cited

U.S. PATENT DOCUMENTS 4,262,631   4/1981   Kubacki .................................. 118/723

OTHER PUBLICATIONS

Tsuchimoto, "Plasma stream transport method (2) Use of charge exchange plasma source", J. Vac. Sci. Technol., 15(5), Sep./Oct. 1978, pp. 1730–1733.

Seaward et al, "Role of ions in electron cyclotron resonance plasma–enhanced chemical vapor deposition of silicon dioxide," J. Vac. Sci. Technol. B 13(1), Jan./Feb. 1995, pp. 118–124.

Apblett et al, "Silicon nitride growth in a high–density plasma system", Solid State Technology, Nov. 1995, pp. 73–80.

*Primary Examiner*—Bernard Pianalto
*Attorney, Agent, or Firm*—M. E. Lachman; M. W. Sales; W. K. Denson-Low

[57] ABSTRACT

Passivating coatings are formed on populated electronic boards, such as a sealed chip on board electronic module, or the like, using a high density plasma deposition method that employs an electron cyclotron resonance (ECR) reactor. A populated electronic board is disposed in the electron cyclotron resonance reactor. A high density nitride plasma is generated by means of electron resonance in the reactor. The plasma is formed adjacent to a magnetic field coil where an ECR condition is established. The high density plasma forms a passivating coating that covers the populated electronic board with a silicon nitride passivating layer. To form the plasma, a mixture of silane and ammonia may be injected into the reactor to produce excited atoms that form a substantially oxygen-free nitride passivating coating. The substantially oxygen-free nitride passivating coating is deposited at a relatively low temperature, typically below 150 degrees Celsius and preferably below 100 degrees Celsius so that the components of the populated board are not damaged.

13 Claims, 1 Drawing Sheet

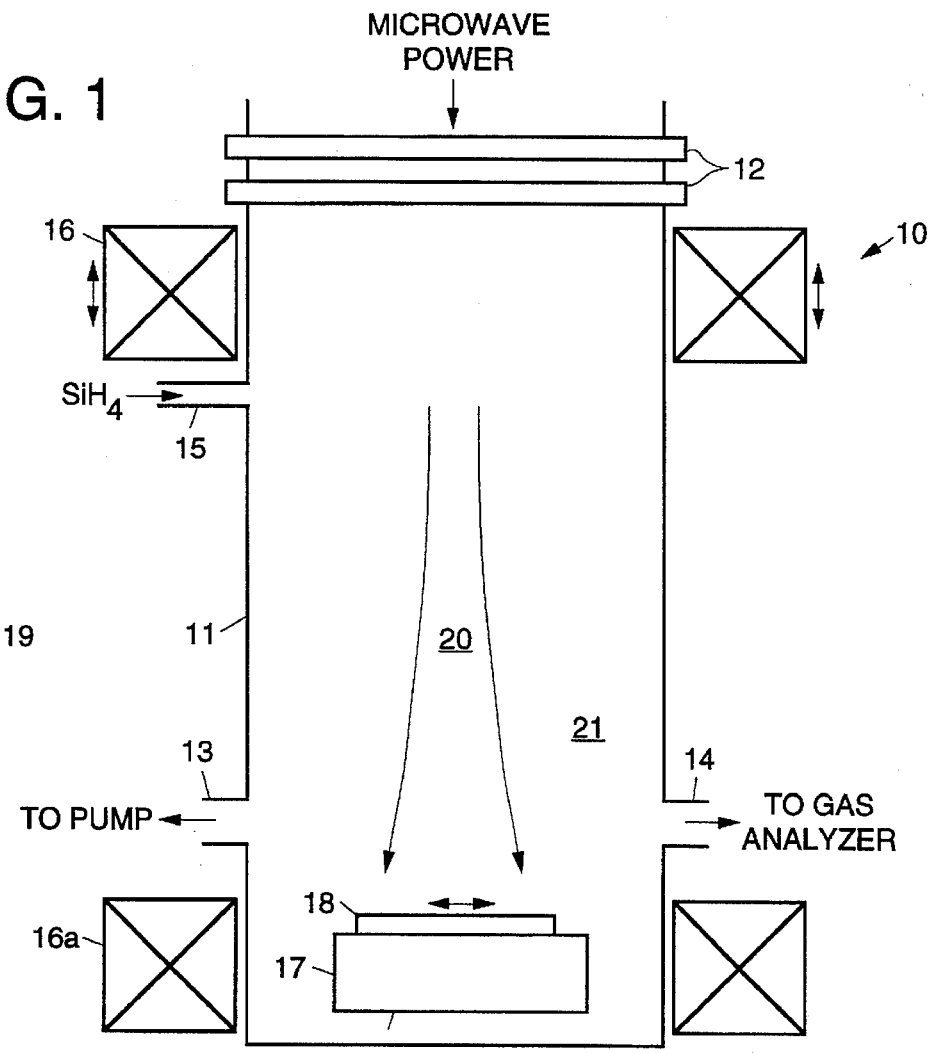
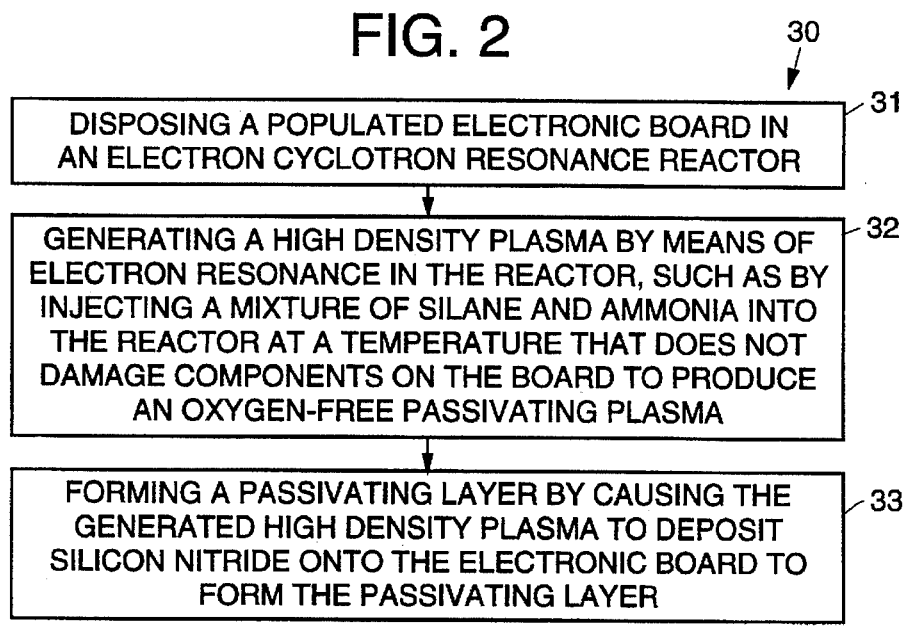

PASSIVATION OF ELECTRONIC MODULES USING HIGH DENSITY PLASMAS

BACKGROUND OF THE INVENTION

The present invention relates generally to processing methods for passivating electronic boards, and more particularly, to a method of passivating electronic boards using high density substantially oxygen-free silicon nitride plasmas.

Sealed chip on board (SCOB) processing is a method of coating electronic modules with a thin inorganic passivating layer that provides protection against environmental threats, and which eliminates the need for hermetically packaging the board. The SCOB technology has been developed by the assignee of the present invention, and recent developments have focused on protective coatings of silicon nitride deposited by a low density plasma.

SCOB processed electronic modules require a thin coating of a dielectric material that is deposited uniformly over a relatively large board (typically SAM or SEM(E) size). In order to protect all parts of the circuit, the protective coating must cover portions of bond pads that are hidden by wire bonds. The board is fully populated prior to coating, and the process must not raise the temperature of the board to a temperature that will cause damage. This maximum processing temperature may be as high as 150 degrees Celsius, but a limit of 100 degrees Celsius is normally desired. Also, the processing must not damage semiconductor devices on the board. The protective coating must adhere well to all the surfaces that are to be protected, should be expansion matched so it can pass thermal cycle testing, and should exhibit low stress, preferably compressive.

The general consensus at the assignee of the present invention has been that the requirements for a SCOB passivation coating can only be met by an inorganic material, of which the preferred choice is silicon nitride. Both low frequency, low density plasma chemical vapor deposition processes and high frequency, high density plasma chemical vapor deposition processes allow deposition of insulating films such as silicon nitride or oxide at low temperatures, below 100 degrees Celsius. Ideally, silicon nitride has a formula $Si_3N_4$, but coatings usually have an excess of silicon and may contain significant concentrations of oxygen and hydrogen. The effects of Si:N ratio, oxygen and hydrogen concentrations on the effectiveness of the passivation layer are not well characterized.

Large area, low temperature silicon nitride coatings evaluated by the present assignee have been deposited by Ionic Systems, located in Salinas, Calif., using a low density plasma process which is disclosed in U.S. Pat. No. 4,262,631. The oxygen content has been extremely variable, from essentially $SiO_2$ to an oxygen to silicon ratio of 0.05:3. Silicon oxynitride may be an acceptable passivation coating, but the variation in properties associated with this composition variability is clearly unacceptable in a manufacturing process.

Electron cyclotron resonance (ECR) plasma deposition is generally described in an article by T. Tsuchimoto, J. Vac. Sci. Technol., volume 15, page 1730 (1978). A typical ECR plasma reactor is disclosed in this article. The electron resonance frequency is normally in the microwave range, at about 2.45 GHz, with an 875 Gauss peak magnetic field. Silane is injected into an excited oxygen plasma or into the afterglow thereof. The Tsuchimoto article discusses the deposition of silicon oxide using the ECR plasma reactor.

An article by K. L. Seaward et at. entitled "Role of ions in electron cyclotron resonance plasma-enhanced chemical vapor deposition of silicon dioxide", in J. Vac. Sci. Technol., volume B13, page 118 (1995), compared deposition conditions with film quality and showed that higher quality silicon dioxide films are made at low temperature with high density plasmas. The Seaward et al. study used a reactor from Oxford Plasma Technology, and showed systematic trends in film properties and composition with system variables, including plasma variables. Thus, heretofore, a high density plasma chemical vapor deposition process using an electron cyclotron resonance reactor has been used to deposit silicon dioxide coatings at low temperatures.

An article by Apblett et al. entitled "Silicon nitride growth in a high-density plasma system" in Solid State Technology, November 1995 discusses growth of silicon nitride on surfaces of silicon wafers using a high-density plasma. This article addresses creating surface layers at relatively high processing temperatures compared to the present invention, typically in the range of about 400 degrees Celsius, which is too hot for the application addressed by the present invention. In addition, this article does not address the problem of passivating fully populated electronic boards, which requires relatively low temperatures, typically less than 150 degrees Celsius, and preferably below 100 degrees Celsius.

Accordingly, it is an objective of the present invention to provide for a method of passivating electronic boards using high density substantially oxygen-free silicon nitride plasmas.

SUMMARY OF THE INVENTION

To meet the above and other objectives, the present invention provides for a method of passivating a populated electronic board or module, such as a sealed chip on board electronic module, or the like, using a high density substantially oxygen-free silicon nitride plasma. Using the present method, the high density substantially oxygen-free silicon nitride plasma, generated in an electron cyclotron resonance (ECR) reactor, is used to form a passivating coating that covers the electronic board. The present method is performed at relatively low temperatures, typically less than 150 degrees Celsius, and preferably below 100 degrees Celsius. These temperatures will not damage the components on the populated electronic boards.

The present high density plasma deposition method achieves passivation of the populated electronic boards in areas that are shadowed by wire bonds, and the like, which has not been heretofore achieved. High density plasma deposition in accordance with the present invention uses a magnetic field to concentrate a plasma generated in the electron cyclotron resonance reactor, in which energy is supplied at a field-dependent precession frequency of the electrons within the plasma.

The present high density plasma deposition method deposits substantially oxygen-free nitride films, whereas silicon nitride films deposited from low density plasmas have exhibited high and variable oxygen content. The use of the present method allows films to be deposited on populated electronic boards with better control of thickness, stress and hydrogen content than with the low density deposition method, and at lower cost.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates passivation of an electronic module in a plasma reactor using a high density plasma deposition method in accordance with the principles of the present invention; and FIG. 2 is a flow diagram illustrating the present method.

DESCRIPTION OF THE PREFERRED EMBODIMENTS

Referring to the drawing figures, FIG. 1 illustrates passivation of an electronic module 18 or electronic board 18 using a high density plasma deposition method 30 in accordance with the principles of the present invention. FIG. 1. shows a schematic of an electron cyclotron resonance (ECR) reactor 10 that may be used to implement the present method 30.

The reactor 10 comprises a housing 11 having a quartz window 12, a plasma gas inlet port 15, and pump and gas analyzer ports 13, 14 that are connected to a gas pump and gas analyzer. The electronic board 18 that is to be passivated is disposed on a moveable platen 17 or chuck 17 disposed within the reactor 10. A moveable primary magnetic field coil 16 is disposed around the housing 11 and is used to move a plasma 20 formed in the reactor 10 so that atoms comprising the plasma 20 are deposited onto the electronic board 18 to form a passivation layer or coating thereon. A secondary magnetic field coil 16a is typically disposed adjacent the platen 17 and is used to tailor the flow of the plasma 20. A plasma forming gas such as a mixture of dichlorosilane and ammonia, for example, is injected into the reactor 10 via the plasma gas inlet port 15.

The plasma 20 is formed in the vicinity of the primary magnetic field coil 16 where an ECR condition is established. By moving the primary coil 16 and adjusting the secondary coil 16a, control is exerted over the plasma 20, which provides controlled focusing of the plasma 20 onto the electronic module 18 that is to be passivated. The primary coil 16a may be disposed such that it is located relatively close to or distal from the electronic board 18 so that the board 18 is located in an afterglow 21 of the plasma 20.

The reactor 10 shown in FIG. 1 and the operation thereof is generally described in the Apblett et al. article cited above. However, the present invention may also use a modified reactor 10 that permits planetary motion of the electronic board 18 to reduce shadowing by wire bonds formed thereon. This is provided by the moveable platen 17 or chuck 17.

Referring to FIG. 2, it shows a flow diagram illustrating the present method 30. The method 30 provides for passivating an electronic module 18 or board 18, such as a sealed chip on board electronic module 11, or the like, using a high density substantially oxygen-free nitride plasma 20. In accordance with the present method 30, the electronic board 18 is disposed 31 in the electron cyclotron resonance (ECR) reactor 10. The high density substantially oxygen-free plasma 20, such as a substantially oxygen-free silicon nitride plasma 20, for example, is generated 32 by means of electron resonance in the reactor 10. A magnetic field is generated to concentrate a plasma generated in the reactor 10, in which energy is supplied at a field-dependent precession frequency of the electrons within the plasma 20. The passivating coating or layer is formed 33 by moving the high density plasma 20 relative to the electronic board 18 to passivate the electronic board 18. Silane ($SiH_4$) is injected into the excited plasma 20 or into the afterglow 21 thereof in order to produce excited atoms that form the substantially oxygen-free nitride passivating layer on the board 18.

The high density plasma deposition method 30 allows deposition of substantially oxygen-free nitride films or passivating coatings at relatively low temperatures, below 100 to 150 degrees Celsius. In contrast, silicon nitride (SiN) films deposited using low density plasma have had high and variable oxygen content. The use of the present deposition method 30 using ECR generated plasma allows passivating coatings to be deposited on electronic boards 18 with better control of thickness, stress and hydrogen content than with the low density method, and at lower cost.

Table 1 compares typical ECR plasma conditions with those in a low density (RF, with typically 13 MHz frequency) plasma. Table I is cited in the K. L. Seaward et al. article. The ambient pressure is much lower using ECR deposition, and which is 2 mTorr versus 500 mTorr in the RF plasma. Most significant, however, is the ratio of ions to neutral or excited species. In the RF case, about ten percent of the neutral atoms are excited and the degree of ionization is 1 in $10^6$, while in the ECR case about 50 percent of the atoms are excited and the degree of ionization is 1 in 100. Using ECR plasma deposition, the ratio of excited atoms to ions is around 50, but in the RF plasma it is about 100,000.

TABLE I

| Parameter | RF plasma | ECR plasma |
| --- | --- | --- |
| Pressure (mTorr) | 500 | 2 |
| n (cm$^{-3}$) | $2 \times 10^{16}$ | $7 \times 10^{13}$ |
| n* (reactive species) | <10% n | >50% n |
| $n_i$ (ions) | $10^{-6}$ n | $10^{-2}$ n |
| $n^*/n_i$ | 100,000 | 50 |

In summary, the present high density plasma chemical vapor deposition electron cyclotron resonance method 30 is capable of depositing substantially oxygen-free silicon nitride coatings at low temperatures, with large area capability. The quality of the coatings is very good, and the behavior of the plasma is relatively well understood.

Thus, a method of passivating electronic modules using high density substantially oxygen-free silicon nitride plasmas has been disclosed. It is to be understood that the described embodiment is merely illustrative of some of the many specific embodiments which represent applications of the principles of the present invention. Clearly, numerous and varied other arrangements may be readily devised by those skilled in the art without departing from the scope of the invention.

What is claimed is:

1. A method of passivating and electronic board, said method comprising the steps of:

disposing a populated electronic board in an electron cyclotron resonance reactor;

generating a high density substantially oxygen-free nitride plasma by means of electron resonance in the reactor; and forming a passivating layer that covers the electronic board by moving the high density substantially oxygen-free nitride plasma relative to the populated electronic board.

2. The method of claim 1 wherein the populated electronic board is a sealed chip on board electronic module.

3. The method of claim 1 wherein the step of generating a high density substantially oxygen-free nitride plasma comprises the step of generating a high density substantially oxygen-free nitride plasma at a temperature below 100 degrees Celsius.

4. The method of claim 1 wherein the step of generating a high density substantially oxygen-free nitride plasma comprises the step of generating a high density substantially oxygen-free nitride plasma at a temperature below 150 degrees Celsius.

5. The method of claim 1 wherein the step of generating a high density substantially oxygen-free nitride plasma comprises the step of generating a high density substantially oxygen-free silicon nitride plasma.

6. The method of claim 1 wherein the step of generating the high density substantially oxygen-free nitride plasma comprises the step of injecting a mixture of silane and ammonia into the reactor to produce excited atoms that form the substantially oxygen-free nitride passivating layer.

7. The method of claim 1 wherein the step of generating the high density substantially oxygen-free nitride plasma comprises the step of injecting a mixture of silane and ammonia into the afterglow of the excited plasma to produce excited atoms that form the substantially oxygen-free nitride passivating layer.

8. A method of passivating a populated electronic board, said method comprising the steps of:

disposing a populated electronic board in an electron cyclotron resonance reactor;

generating a high density substantially oxygen-free silicon nitride plasma by means of electron resonance in the reactor; and forming a passivating layer that covers the electronic board by moving the high density substantially oxygen-free silicon nitride plasma relative to the electronic board.

9. The method of claim 8 wherein the populated electronic board is a sealed chip on board electronic module.

10. The method of claim 8 wherein the step of generating a high density substantially oxygen-free silicon nitride plasma comprises the step of generating a high density substantially oxygen-free silicon nitride plasma at a temperature below 100 degrees Celsius.

11. The method of claim 8 wherein the step of generating a high density substantially oxygen-free silicon nitride plasma comprises the step of generating a high density substantially oxygen-free silicon nitride plasma at a temperature below 150 degrees Celsius.

12. The method of claim 8 wherein the step of generating the high density substantially oxygen-free silicon nitride plasma comprises the step of injecting a mixture of silane and ammonia into the reactor to produce excited atoms that form the substantially oxygen-free nitride passivating layer.

13. The method of claim 8 wherein the step of generating the high density substantially oxygen-free silicon nitride plasma comprises the step of injecting a mixture of silane and ammonia into the afterglow of the excited plasma to produce excited atoms that form the substantially oxygen-free nitride passivating layer.

* * * * *